(12) United States Patent
Kitabayashi et al.

(10) Patent No.: US 8,916,462 B2
(45) Date of Patent: Dec. 23, 2014

(54) METHOD FOR MANUFACTURING SEMICONDUCTOR DEVICE

(75) Inventors: Hiroyuki Kitabayashi, Osaka (JP); Hideto Tamaso, Osaka (JP); Taku Horii, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 11 days.

(21) Appl. No.: 13/610,673

(22) Filed: Sep. 11, 2012

(65) Prior Publication Data

US 2013/0143398 A1 Jun. 6, 2013

Related U.S. Application Data

(60) Provisional application No. 61/566,461, filed on Dec. 2, 2011.

(30) Foreign Application Priority Data

Dec. 2, 2011 (JP) .................................. 2011-264285

(51) Int. Cl.
H01L 21/283 (2006.01)

(52) U.S. Cl.
USPC .................... 438/602; 438/666; 257/E21.159

(58) Field of Classification Search
USPC .......................................... 438/602, 666, 931
See application file for complete search history.

(56) References Cited

U.S. PATENT DOCUMENTS

| | | | |
|---|---|---|---|
| 5,405,789 A | 4/1995 | Dekker et al. | |
| 7,547,578 B2 | 6/2009 | Agarwal et al. | |
| 2008/0280402 A1 | 11/2008 | Moriwaka | |
| 2009/0267072 A1* | 10/2009 | Yamazaki et al. | 257/59 |
| 2011/0266558 A1* | 11/2011 | Yano | 257/77 |
| 2011/0284871 A1 | 11/2011 | Harada et al. | |
| 2012/0126250 A1 | 5/2012 | Tamaso | |

FOREIGN PATENT DOCUMENTS

| | | |
|---|---|---|
| JP | 6-204167 | 7/1994 |
| JP | 2002-270676 | 9/2002 |
| JP | 2008-311633 | 12/2008 |
| JP | 2010-272766 | 12/2010 |
| JP | 2011-243770 | 12/2011 |
| WO | WO-2011/128994 A1 | 10/2011 |

OTHER PUBLICATIONS

Feng et al. (eds.), "Silicon Carbide: Materials, Processing, and Devices," vol. 20, Taylor & Francis Books, Inc., pp. 203-280 (2004).

* cited by examiner

*Primary Examiner* — Alexander Ghyka

(74) *Attorney, Agent, or Firm* — Venable LLP; Michael A. Sartori; F. Brock Riggs

(57) ABSTRACT

A method for manufacturing a MOSFET includes the steps of: preparing a substrate made of silicon carbide; forming a drain electrode making ohmic contact with the substrate; and forming a backside pad electrode on and in contact with the drain electrode. The drain electrode formed in the step of forming the drain electrode is made of an alloy containing Ti and Si. Further, the backside pad electrode formed is maintained at a temperature of 300° C. or smaller until completion of the MOSFET. Accordingly, the manufacturing process can be efficient while achieving excellent adhesion between the electrodes.

17 Claims, 17 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, more particularly, a method for manufacturing a semiconductor device so as to provide an efficient manufacturing process while achieving excellent adhesion between electrodes.

2. Description of the Background Art

In recent years, in order to achieve high breakdown voltage, low loss, and the like in semiconductor devices, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

An exemplary semiconductor device adopting silicon carbide as its material is a semiconductor device, such as a MOSFET (Metal Oxide Semiconductor Field Effect Transistor), for conducting and interrupting a current by controlling appearance/disappearance of an inversion layer in a channel region based on a predetermined threshold voltage. The MOSFET is structured such that an oxide film, electrodes, and the like are formed on a substrate having an active region formed by introduction of a desired impurity or the like. In order to improve reliability of the device, excellent electric contact between the substrate and each electrode as well as high adhesion between the electrodes are required.

In a process of manufacturing such a MOSFET, the substrate having the active region formed therein is grinded, polished, or etched to be thinned to a desired thickness. Thereafter, onto the grinded surface, a contact electrode made of, for example, Ni is formed (for example, see U.S. Pat. No. 7,547,578). The contact electrode reacts with Si constituting the substrate as a result of annealing or the like employing, for example, laser irradiation and is accordingly silicided, thereby making ohmic contact with the substrate. In the case where such a Ni-based electrode is employed as the contact electrode, excellent electric contact can be achieved between the substrate and the electrode. However, when annealing the electrode, deposition of amorphous carbon and formation of irregularities take place on a surface of the electrode. This leads to deteriorated adhesion with a pad electrode to be formed on the contact electrode, with the result that reliability of the device is decreased, disadvantageously (for example, see Zhe Chuan Feng, Jian H. Zhao, "Silicon carbide: materials, processing, and devices", Volume 20, Taylor & Francis Books, Inc, 2004, pp. 203-280).

Regarding durability of the MOSFET, there is the following problem. That is, due to long-term use, an intermetallic compound having a high resistance may be formed between the contact electrode and the pad electrode to result in a difficulty in stably operating the MOSFET. To address this, for example, study has been conducted with regard to improvement of a metal material constituting the contact electrode and the pad electrode (for example, see Japanese Patent Laying-Open No. 2010-272766).

Further, in the process of manufacturing the MOSFET, heating treatment (sintering) may be performed after the formation of the pad electrode, in order to suppress detachment or the like of the pad electrode due to the deteriorated adhesion between the contact electrode and the pad electrode. Specifically, in the process of manufacturing the semiconductor device such as the MOSFET, the heating treatment is performed after the formation of the pad electrode in order to suppress device yield from being decreased due to the detachment or the like of the pad electrode. This makes it difficult to achieve an efficient manufacturing process, disadvantageously.

SUMMARY OF THE INVENTION

The present invention has been made in view of the foregoing problems, and has its object to provide a method for manufacturing a semiconductor device so as to provide an efficient manufacturing process while achieving excellent adhesion between electrodes.

A method for manufacturing a semiconductor device according to the present invention includes the steps of: preparing a substrate made of silicon carbide; forming a contact electrode making ohmic contact with the substrate; and forming a pad electrode on and in contact with the contact electrode. The contact electrode formed in the step of forming the contact electrode is made of an alloy containing Ti and Si. The pad electrode formed in the step of forming the pad electrode is maintained at a temperature of 300° C. or smaller until completion of the semiconductor device.

Here, in the method for manufacturing the semiconductor device according to the present invention, it is intended that the pad electrode is maintained at a temperature of 300° C. or smaller until the semiconductor device is completed, more particularly, until semiconductor devices manufactured using the substrate made of silicon carbide are completed and are separated into individual semiconductor devices by means of dicing or the like. It is not intended that the pad electrode is maintained in the above-described temperature range in a mounting step etc., that can be performed after the separation into the individual semiconductor devices.

The present inventor has conducted detailed study on schemes to provide a more efficient process of manufacturing a semiconductor device while achieving excellent adhesion between the contact electrode and the pad electrode. As a result, it has been found that when an alloy containing Ti and Si is employed as a material constituting the contact electrode, excellent adhesion between the electrodes can be achieved without performing heating treatment after formation of the pad electrode on and in contact with the contact electrode. Accordingly, the present invention has been conceived.

In the method for manufacturing the semiconductor device according to the present invention, the contact electrode made of the alloy containing Ti and Si is formed. Thus, with no heating treatment being performed after forming the pad electrode on and in contact with the contact electrode, specifically, with the pad electrode being maintained at a temperature of 300° C. or smaller, excellent adhesion between the contact electrode and the pad electrode can be achieved. Thus, according to the method for manufacturing the semiconductor device according to the present invention, there can be provided a method for manufacturing a semiconductor device, whereby an efficient manufacturing process can be provided while achieving excellent adhesion between electrodes.

In the method for manufacturing the semiconductor device, the pad electrode formed in the step of forming the pad electrode may be maintained at a temperature of 100° C. or smaller until the completion of the semiconductor device. Thus, in the method for manufacturing the semiconductor device according to the present invention, even when the pad electrode is maintained at such a lower temperature, excellent adhesion between the contact electrode and the pad electrode can be achieved.

In the method for manufacturing the semiconductor device, the substrate prepared in the step of preparing the substrate may include a structure in which a plurality of SiC substrates each made of single-crystal silicon carbide are arranged side by side when viewed in a plan view and main surfaces of the plurality of SiC substrates at one side are connected to each other by a base layer.

Accordingly, a substrate can be readily prepared which can be handled as a silicon carbide substrate excellent in crystallinity and having a large diameter. As a result, a high-quality semiconductor device can be manufactured more efficiently.

The method for manufacturing the semiconductor device may include, before the step of forming the contact electrode, the steps of: fabricating a first intermediate substrate by forming an active region in the substrate; fabricating a second intermediate substrate by forming an electrode layer on a side of the substrate opposite to its side where the contact electrode is to be formed; supporting the second intermediate substrate using an adhesive tape by adhering, to the adhesive tape, the side of the second intermediate substrate on which the electrode layer is formed; and grinding a main surface of the substrate at the side where the contact electrode is to be formed, with the second intermediate substrate being supported by the adhesive tape. The step of forming the contact electrode may include the steps of: forming a metal layer made of an alloy containing Ti and Si on the main surface grinded, with the second intermediate substrate being supported by the adhesive tape; and fabricating a third intermediate substrate in which the contact electrode is formed on the second intermediate substrate, by heating the metal layer. In the step of forming the pad electrode, a fourth intermediate substrate may be fabricated by forming the pad electrode on and in contact with the contact electrode, with the third intermediate substrate being supported by the adhesive tape.

Accordingly, on the main surface of the substrate thus grinded, the contact electrode and the pad electrode can be formed more readily.

In the method for manufacturing the semiconductor device, in the step of fabricating the third intermediate substrate, the metal layer may be locally heated. In this way, the metal layer can be heated while restraining temperature increase in a region adjacent to the metal layer.

In the method for manufacturing the semiconductor device, in the step of fabricating the third intermediate substrate, the metal layer may be locally heated by irradiating the metal layer with laser. In this way, the local heating of the metal layer can be more readily done.

In the method for manufacturing the semiconductor device, the step of forming the contact electrode may include the step of forming a thin film including a Ti portion and a Si portion. Accordingly, energy for forming the contact electrode making ohmic contact with the substrate can be reduced.

In the method for manufacturing the semiconductor device, the thin film may be formed by mixing the Ti portion and the Si portion with each other. In this way, the energy for forming the contact electrode making ohmic contact with the substrate can be reduced.

In the method for manufacturing the semiconductor device, the thin film may be formed by stacking a layer constituted of the Ti portion and a layer constituted of the Si portion on each other. In this way, the energy for forming the contact electrode making ohmic contact with the substrate can be reduced.

In the method for manufacturing the semiconductor device, the thin film may have a film thickness of 10 nm or greater. Accordingly, the thin film can be produced stably.

In the method for manufacturing the semiconductor device, the thin film may contain Ti at a content of not less than 20 volume % and not more than 95 volume %. In this way, the energy for forming the contact electrode making ohmic contact with the substrate can be reduced.

In the method for manufacturing the semiconductor device, the thin film may contain Ti at a content of not less than 50 volume % and not more than 70 volume %. In this way, the energy for forming the contact electrode making ohmic contact with the substrate can be further reduced.

In the method for manufacturing the semiconductor device, in the step of performing the annealing, the thin film may be locally heated by irradiating the thin film with laser. In this way, the thin film can be heated while restraining temperature increase in a region adjacent to the thin film.

In the method for manufacturing the semiconductor device, the laser may have an energy density of not less than 1.9 J/cm$^2$ and not more than 2.2 J/cm$^2$. When the energy density in the laser irradiation is 1.9 J/cm$^2$ or greater, excellent ohmic contact can be achieved. Meanwhile, when the energy density in the laser irradiation is 2.2 J/cm$^2$ or smaller, surface roughness of the contact electrode can be suppressed.

In the method for manufacturing the semiconductor device, the laser may have an irradiation beam spot having an area of 0.03 mm$^2$ or greater. Accordingly, the annealing can be performed for a shorter time.

In the method for manufacturing the semiconductor device, in-plane power distribution of an irradiation beam spot of the laser may be within ±30%. Accordingly, surface roughness of the contact electrode after the laser irradiation can be suppressed, which leads to improved adhesion between the contact electrode and the pad electrode.

In the method for manufacturing the semiconductor device, each of a scanning step of an irradiation beam spot of the laser in a laser scanning direction and a pitch width between adjacent irradiation lines thereof may be equal to or smaller than a half of a diameter of the irradiation beam spot. Accordingly, the contact resistance between the substrate and the contact electrode can be sufficiently reduced.

As apparent from the description above, according to the method for manufacturing the semiconductor device in the present invention, there can be provided a semiconductor device so as to provide an efficient manufacturing process while achieving excellent adhesion between electrodes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
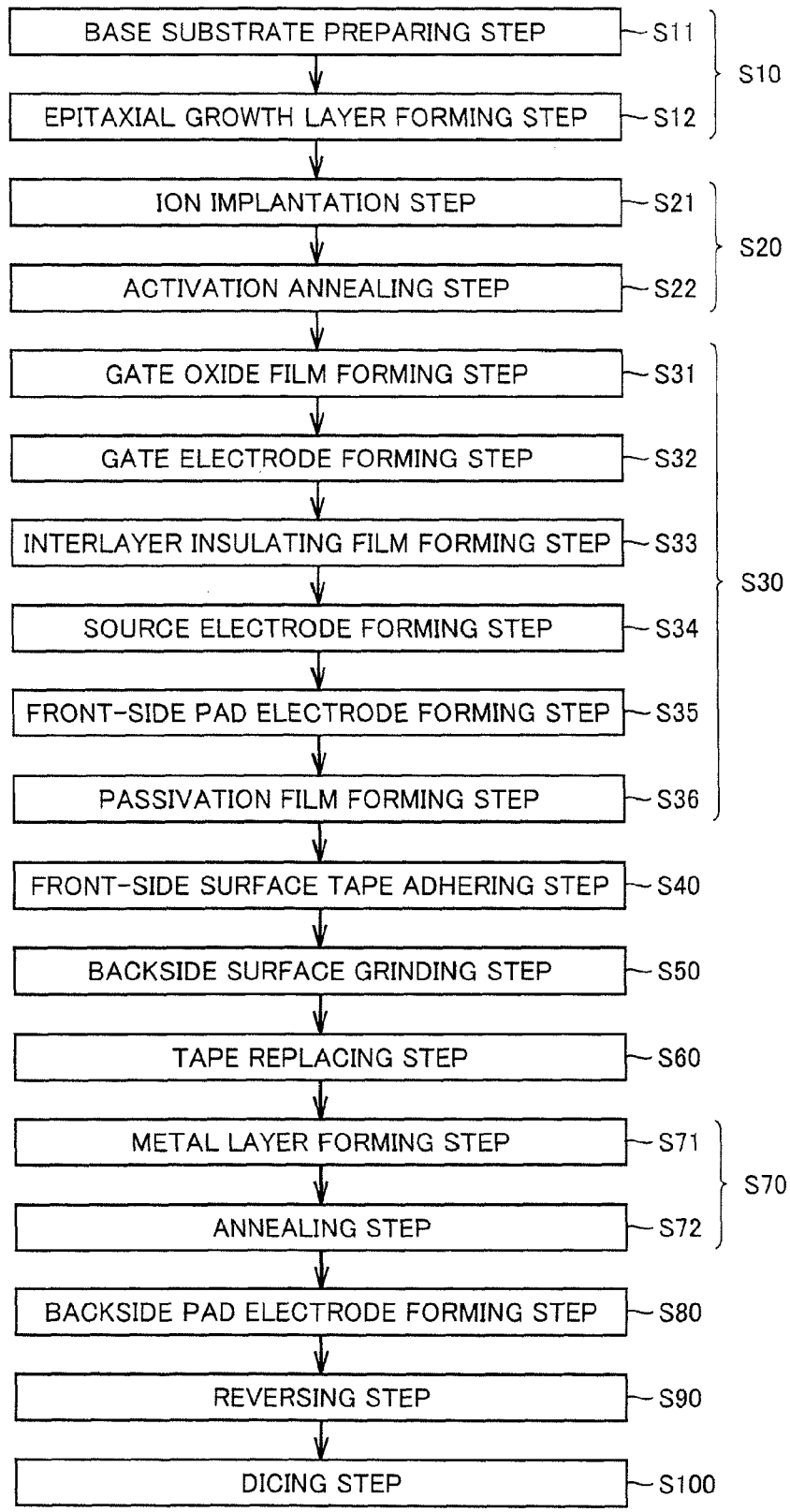
FIG. 1 is a flowchart schematically showing a method for manufacturing a MOSFET.
Figure 2:
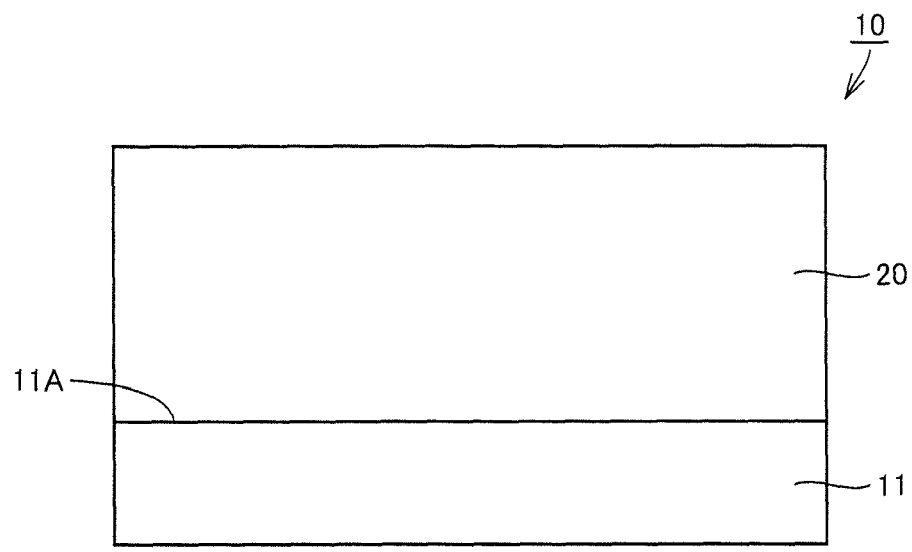
FIG. 2 is a schematic cross sectional view for illustrating the method for manufacturing the MOSFET.
Figure 3:
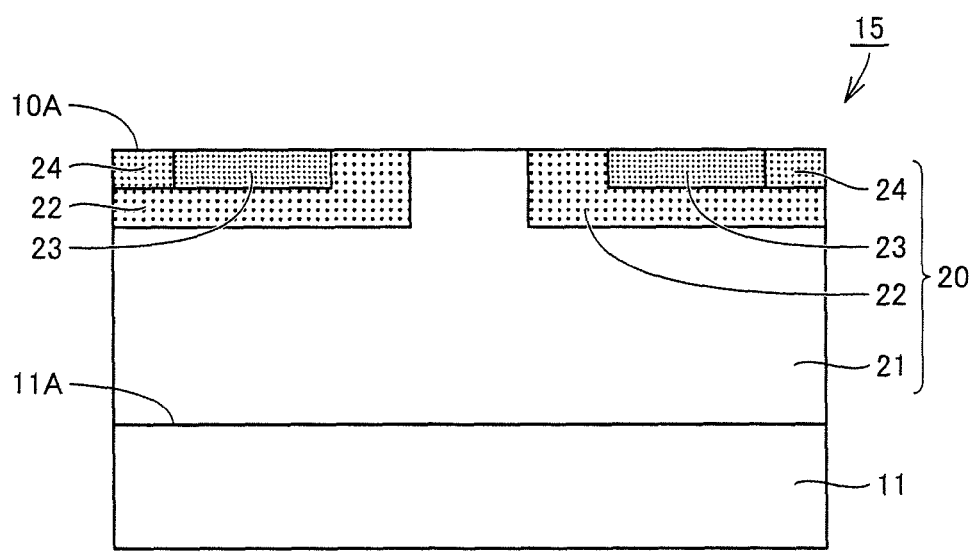
FIG. 3 is a schematic cross sectional view for illustrating the method for manufacturing the MOSFET.
Figure 4:
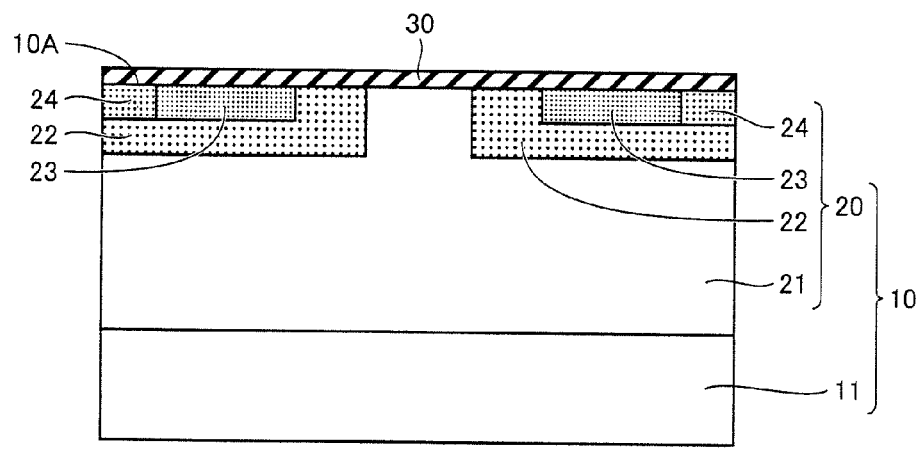
FIG. 4 is a schematic cross sectional view for illustrating the method for manufacturing the MOSFET.
Figure 5:
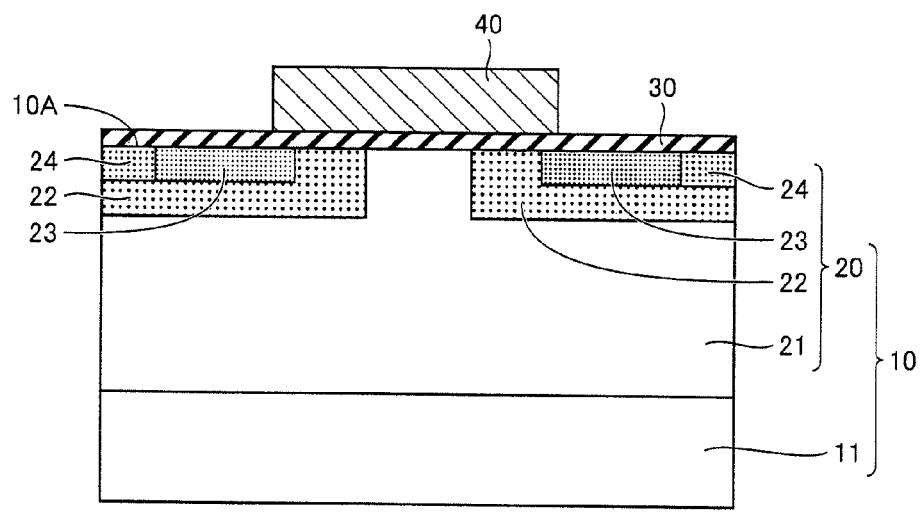
FIG. 5 is a schematic cross sectional view for illustrating the method for manufacturing the MOSFET.

The following describes embodiments of the present invention with reference to figures. In the below-described figures, the same or corresponding portions are given the same reference characters and are not described repeatedly. Further, in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

(First Embodiment)

First, a method for manufacturing a semiconductor device in a first embodiment, i.e., one embodiment of the present invention will be described with reference to FIG. 1 to FIG. 14. Referring to FIG. 1, as a step (S10), a substrate preparing step is first performed. In this step (S10), steps (S11) and (S12) described below are performed to prepare a substrate 10 made of silicon carbide.

First, as step (S11), a base substrate preparing step is performed. In this step (S11), referring to FIG. 2, for example, an ingot (not shown) made of 4H—SiC is sliced to prepare a base substrate 11 made of silicon carbide and having n type conductivity (first conductivity type).

Next, as step (S12), an epitaxial growth layer forming step is performed. In this step (S12), referring to FIG. 2, a semiconductor layer 20 made of silicon carbide and having n type conductivity is formed on a main surface 11A of base substrate 11 by means of epitaxial growth. In this way, substrate 10 including base substrate 11 and semiconductor layer 20 is prepared.

Next, an active region forming step is performed as a step (S20). In this step (S20), steps (S21) and (S22) described below are performed to fabricate a first intermediate substrate 15 in which an active region is formed in substrate 10.

First, as step (S21), an ion implantation step is performed. In this step (S21), referring to FIG. 3, for example, Al ions are first implanted into a region including a main surface 10A of substrate 10, thereby forming body regions 22 of p type conductivity (second conductivity type) in semiconductor layer 20. Next, for example, P ions are implanted into body regions 22 at a depth shallower than the depth for the implantation of the Al ions, thereby forming source regions 23 of n type conductivity. Then, for example, Al ions are further implanted into each of body regions 22, thereby forming a contact region 24, which is adjacent to corresponding source region 23, has a depth as deep as that of source region 23, and has p type conductivity. Further, semiconductor layer 20 has a region in which none of body region 22, source region 23, and contact region 24 is formed. This region serves as a drift region 21.

Next, as step (S22), an activation annealing step is performed. In this step (S22), substrate 10 is heated to activate the impurities introduced in the above-described step (S21). Accordingly, desired carriers are generated in the regions having the impurities introduced therein. In this way, first intermediate substrate 15 is fabricated in which the active region is formed in substrate 10.

Next, as step (S30), an electrode layer forming step is performed. In this step (S30), referring to FIG. 4 to FIG. 8, a second intermediate substrate 16 is fabricated in which an electrode layer 100 is formed on substrate 10 at its side opposite to the side on which a drain electrode 51 is to be formed in a subsequent step (S70). Electrode layer 100 includes a gate oxide film 30, a gate electrode 40, an interlayer insulating film 60, source electrodes 50, a front-side pad electrode 70, and a passivation film 90, which are formed in steps (S31) to (S36) described below.

First, as step (S31), a gate oxide film forming step is performed. In this step (S31), referring to FIG. 4, first intermediate substrate 15 is heated in an atmosphere containing, for example, oxygen, thereby forming gate oxide film 30 made of $SiO_2$ (silicon dioxide) so as to cover main surface 10A.

Next, as step (S32), a gate electrode forming step is performed. In this step (S32), referring to FIG. 5, for example, a LPCVD (Low Pressure Chemical Vapor Deposition) method is used to form gate electrode 40 on and in contact with gate oxide film 30. Gate electrode 40 is made of polysilicon including an impurity.

Figure 6:
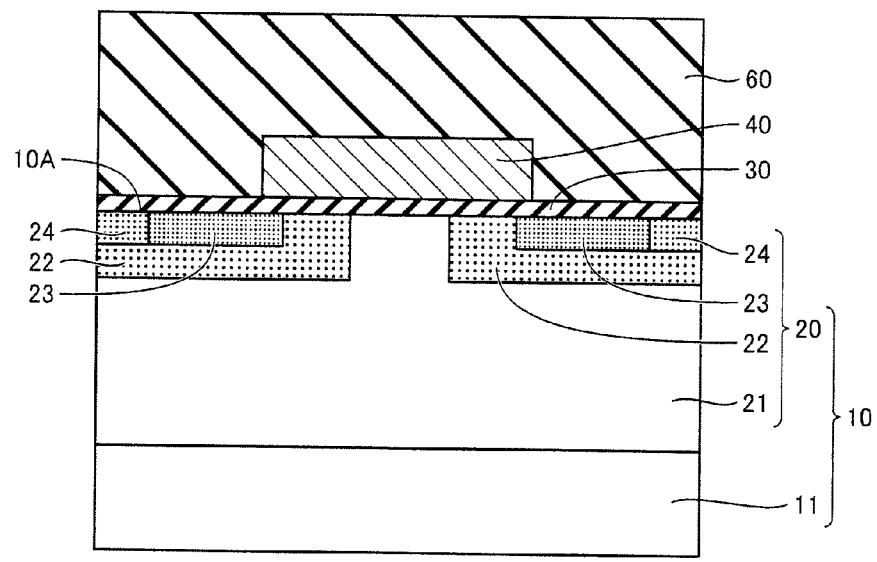
FIG. 6 is a schematic cross sectional view for illustrating the method for manufacturing the MOSFET.
Figure 7:
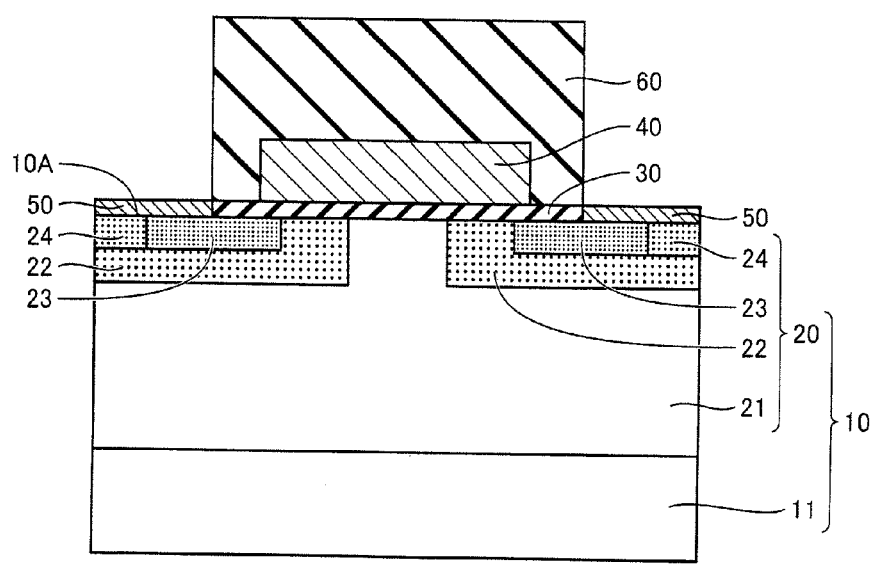
FIG. 7 is a schematic cross sectional view for illustrating the method for manufacturing the MOSFET.
Figure 8:
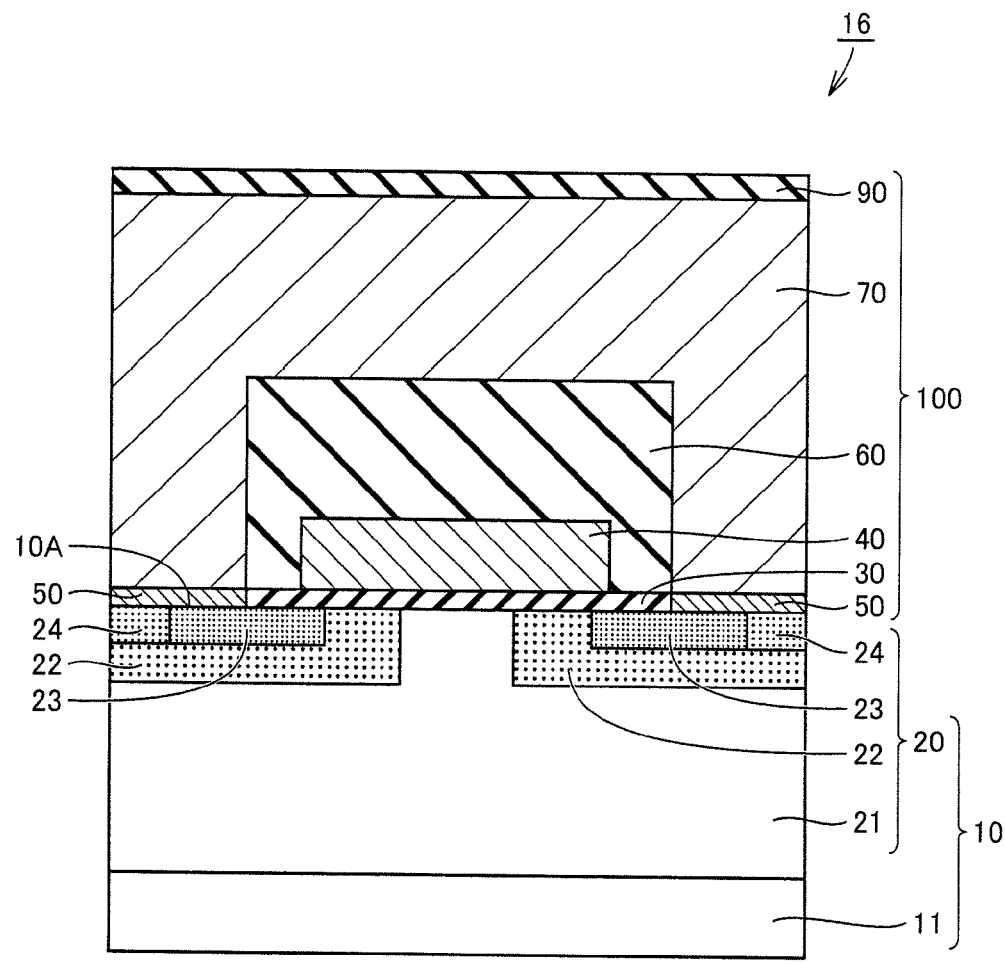
FIG. 8 is a schematic cross sectional view for illustrating the method for manufacturing the MOSFET.
Figure 9:
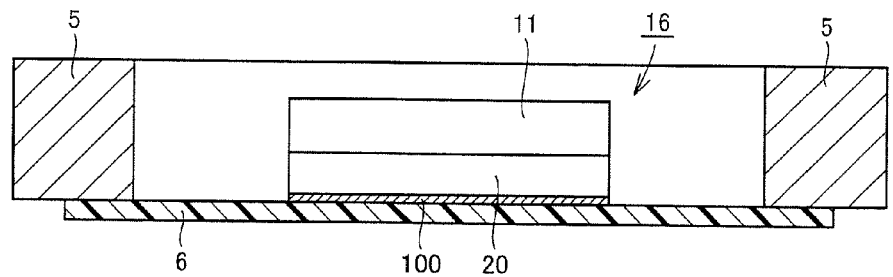
FIG. 9 is a schematic cross sectional view for illustrating the method for manufacturing the MOSFET.
Figure 10:
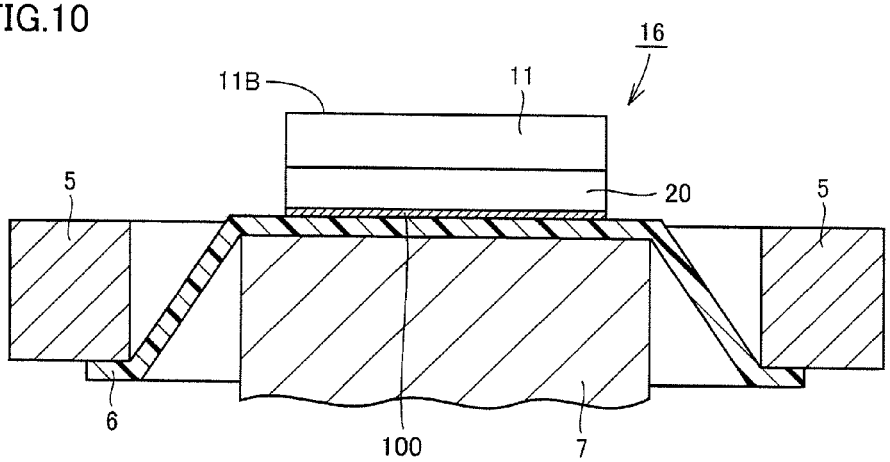
FIG. 10 is a schematic cross sectional view for illustrating the method for manufacturing the MOSFET.

Next, as step (S33), an interlayer insulating film forming step is performed. In this step (S33), referring to FIG. 6, for example, a P (Plasma)-CVD method is used to form interlayer insulating film 60 made of $SiO_2$, so as to cover gate oxide film 30 and gate electrode 40. Further, as shown in FIG. 6, interlayer insulating film 60 is formed to surround gate electrode 40 together with gate oxide film 30.

Next, as step (S34), a source electrode forming step is performed. In this step (S34), referring to FIG. 7, first, portions of interlayer insulating film 60 and gate oxide film 30 are removed from the regions in which source electrodes 50 are to be formed, thereby forming regions in which source regions 23 and contact regions 24 are exposed. Next, for example, a metal layer (not shown) made of, for example, a Ni, NiSi, TiSi, or TiAlSi alloy is formed in each of the regions by means of sputtering. Then, the metal layer is heated to silicide at least a portion of the metal layer, thereby forming source electrode 50.

Next, as step (S35), a front-side pad electrode forming step is performed. In this step (S35), referring to FIG. 8, front-side pad electrode 70 is formed on and in contact with source electrode 50. Specifically, first, for example, a first electrode layer (not shown) made of Ta, TaN, Ti, TiN, or TiW is formed on and in contact with source electrode 50 by means of the sputtering. Then, a second electrode layer (not shown) made of Al, AlSi (Si content of 1%) or AlSiCu (Si content of 1% and Cu content of 0.5%) is formed on the first electrode layer. In this way, front-side pad electrode 70 is formed which is thus structured to have the electrode layers stacked on each other. Further, as the first electrode layer, there may be formed a layer structured to have electrode layers stacked on each other and made of Ta and TaN. It should be noted that by employing Ti, TiN, or TiW for the metal constituting the first electrode layer making contact with source electrode 50, adhesion can be further improved between front-side pad electrode 70 and source electrode 50.

Next, as step (S36), a passivation film forming step is performed. In this step (S36), for example, passivation film 90 made of $SiO_2$ is formed by means of the CVD method to cover front-side pad electrode 70. In this way, second intermediate substrate 16 is fabricated in which electrode layer 100 including gate oxide film 30, gate electrode 40, interlayer insulating film 60, source electrodes 50, front-side pad electrode 70, and passivation film 90 is formed on first intermediate substrate 15.

Next, as a step (S40), a front-side surface tape adhering step is performed. In this step (S40), referring to FIG. 9, a main surface of second intermediate substrate 16 at the electrode layer 100 side is adhered to an adhesive tape 6, whereby second intermediate substrate 16 is supported by adhesive tape 6. Specifically, first, an annular ring frame 5 made of a metal is prepared. Next, adhesive tape 6 is set and held at ring frame 5 to close a hole extending through ring frame 5. With adhesive tape 6 being thus held by ring frame 5, adhesive tape 6 is securely provided with surface smoothness. Next, second intermediate substrate 16 is put on adhesive tape 6 for adhesion such that its main surface at the electrode layer 100 side comes into contact with the adhesive surface of adhesive tape 6. As a result, second intermediate substrate 16, which is thus adhered to adhesive tape 6, is held at a location surrounded by the inner circumference surface of ring frame 5. It should be noted that adhesive tapes having various configurations can be employed as adhesive tape 6, and an exemplary, usable adhesive tape is one which employs polyester for a base material thereof, employs an acrylic adhesive agent for an adhesive agent thereof, and employs polyester for a separator thereof.

Figure 11:
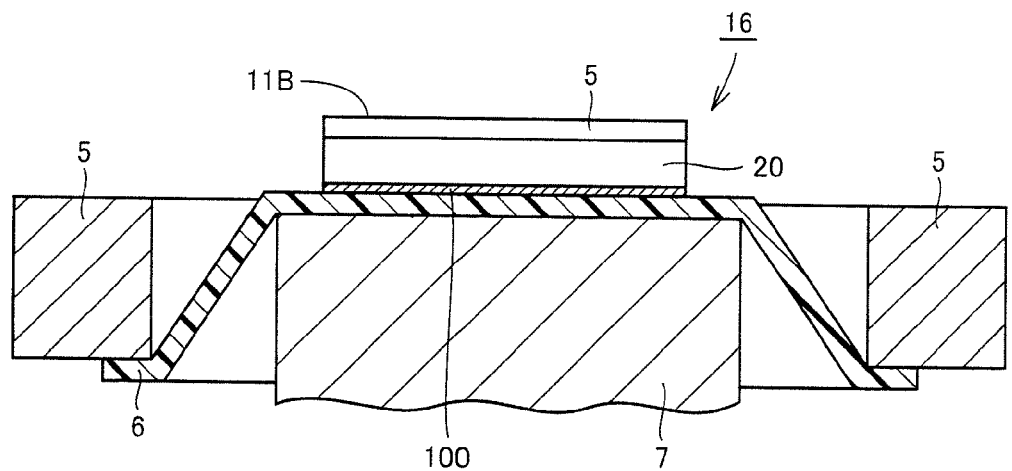
FIG. 11 is a schematic cross sectional view for illustrating the method for manufacturing the MOSFET.
Figure 12:
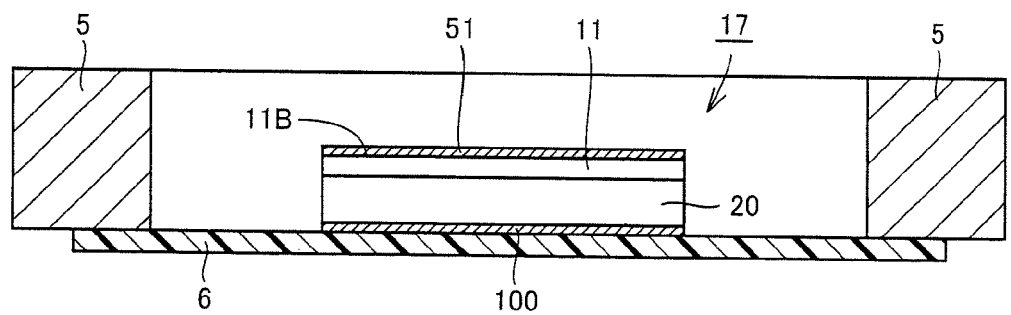
FIG. 12 is a schematic cross sectional view for illustrating the method for manufacturing the MOSFET.
Figure 13:
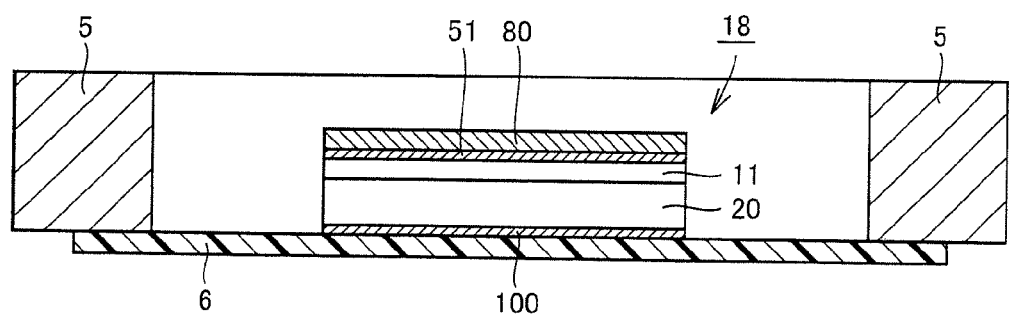
FIG. 13 is a schematic cross sectional view for illustrating the method for manufacturing the MOSFET.

Next, as step (S50), a backside surface grinding step is performed. In this step (S50), while second intermediate substrate 16 is supported by adhesive tape 6, the main surface (main surface 11B of base substrate 11) of second intermediate substrate 16 opposite to the electrode layer 100 side is grinded. Specifically, referring to FIG. 10, the main surface of adhesive tape 6 opposite to its side holding second intermediate substrate 16 is first pressed by a pressing member 7 in the axial direction of ring frame 5. Accordingly, adhesive tape 6 is elastically deformed, whereby at least main surface 11B of base substrate 11 of second intermediate substrate 16 held by adhesive tape 6 is deviated from the location surrounded by the inner circumference surface of ring frame 5. Then, main surface 11B of base substrate 11 is pressed against a grinding surface of a grinding device such as a grinder (not shown), thus grinding base substrate 11. Accordingly, second intermediate substrate 16 is thinned to a desired thickness as shown in FIG. 11.

Next, as a step (S60), a tape replacing step is performed. In this step (S60), adhesive tape 6 is replaced after completing the above-described step (S50) and finishing the pressing of adhesive tape 6 by pressing member 7. This step (S60) is not an essential step in the method for manufacturing the semiconductor device in the present invention, but a problem resulting from damage on adhesive tape 6 can be avoided in advance by replacing adhesive tape 6, which might be damaged in step (S50) as a result of the elastic deformation or the like.

Next, as a step (S70), a contact electrode forming step is performed. In this step (S70), below-described steps (S71) and (S72) are performed to form drain electrode 51 serving as a contact electrode making ohmic contact with substrate 10. Drain electrode 51 thus formed is made of an alloy containing Ti and Si, such as a TiSi alloy or a TiAlSi alloy.

First, as step (S71), a metal layer forming step is performed. In this step (S71), a metal layer made of a TiSi or TiAlSi alloy is formed on main surface 11B of base substrate 11 grinded in the above-described step (S50) while supporting second intermediate substrate 16 by adhesive tape 6. This step (S71) can be performed using, for example, sputtering. In doing so, adhesive tape 6, ring frame 5, and second intermediate substrate 16 may be cooled using a cooling structure (not shown) as required. Further, after completing this step (S71), adhesive tape 6 may be replaced. This replacement of adhesive tape 6 is not essential in the method for manufacturing the semiconductor device in the present invention, but a problem resulting from damage or the like on adhesive tape 6 can be avoided in advance by replacing adhesive tape 6, which might be damaged in the manufacturing processes up to step (S71), or by replacing it with another adhesive tape 6 suitable for subsequent step (S72).

The contact electrode forming step may include the step of forming a thin film including a Ti portion and a Si portion. The thin film including the Ti portion and the Si portion is, for example, a thin film 52 formed by mixing the Ti portion and the Si portion with each other. Here, the Ti portion refers to a region in which a plurality of Ti (titanium) atoms exist, and the Si portion refers to a region in which a plurality of Si (silicon) atoms exist. The expression "thin film 52 formed by mixing the Ti portion and the Si portion with each other" is intended to indicate, for example, a thin film formed by uniformly mixing Ti grains and Si grains, rather than the TiSi alloy. Thin film 52 formed by mixing the Ti portion and the Si portion with each other may be, for example, a thin film formed by randomly mixing Ti grains and Si grains with each other.

Figure 25:
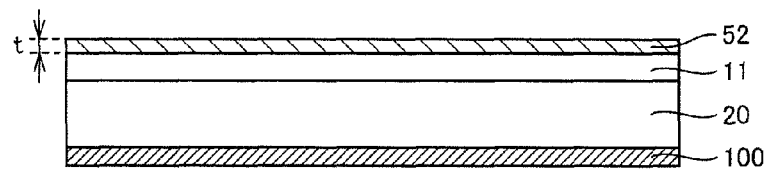
FIG. 25 is a schematic cross sectional view for illustrating the method for manufacturing the MOSFET.
Figure 26:
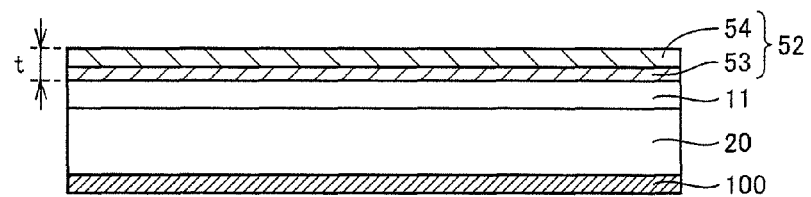
FIG. 26 is a schematic cross sectional view for illustrating the method for manufacturing the MOSFET.

As shown in FIG. 25, thin film 52 is formed on base substrate 11 made of silicon carbide. Further, as shown in FIG. 26, the thin film including the Ti portion and the Si portion may be a thin film 52 formed by stacking a layer 53 constituted of the Ti portion and a layer 54 constituted of the Si portion on each other. In the present embodiment, layer 53 constituted of the Ti portion is formed in contact with base substrate 11 made of silicon carbide, and layer 54 constituted of the Si portion is formed on and in contact with layer 53 constituted of the Ti portion. Layer 54 constituted of the Si portion may be formed in contact with base substrate 11 made of silicon carbide, and layer 53 constituted of the Ti portion may be formed on and in contact with layer 54 constituted of the Si portion. By forming the thin film including the Ti portion and the Si portion as described above, energy for forming the contact electrode making ohmic contact with the substrate can be reduced.

Thin film 52 preferably includes the Ti portion at a content of not less than 20 volume % and not more than 95 volume %. In this way, the energy for forming the contact electrode making ohmic contact with the substrate can be reduced. More preferably, the thin film includes the Ti portion at a content of not less than 50 volume % and not more than 70 volume %. In this way, the energy for achieving ohmic contact can be reduced further. Further, thin film 52 preferably has a thickness t of 10 nm or greater. Accordingly, the thin film can be produced stably.

Thin film 52 can be formed, for example, using the sputtering. Specifically, a target containing Ti and a target containing Si are prepared in a sputtering chamber. For example, in an argon atmosphere, Ti and Si are simultaneously sputtered, thereby forming thin film 52 including the Ti portion and the Si portion. It should be noted that one target in which a ratio of Ti and Si has been adjusted in advance may be used in this sputtering.

Next, as a step (S72), an annealing step is performed. In this step (S72), referring to FIG. 12, the metal layer formed in the above-described step (S71) is heated to fabricate a third intermediate substrate 17 in which drain electrode 51 is formed on second intermediate substrate 16. Specifically, for example, the metal layer is locally heated by means of laser irradiation to silicide at least a portion of the metal film, thereby forming drain electrode 51. By thus employing the laser irradiation as the method for heating the metal layer, the metal layer can be more readily locally heated while restraining temperature increase in a region adjacent to the metal layer. Accordingly, damage can be avoided on electrode layer 100, which contains Al having a low melting point, and adhesive tape 6.

Further, in the annealing step, thin film 52 including the Ti portion and the Si portion may be heated to silicide at least a portion of thin film 52, thereby forming the contact electrode (drain electrode 51) making ohmic contact with the substrate. By heating thin film 52, a contact electrode (drain electrode 51) made of an alloy containing Ti and Si is formed. In order to heat thin film 52, laser annealing may be performed by means of laser irradiation. When thin film 52 is irradiated with laser, thin film 52 is locally heated. In this way, thin film 52 can be heated while restraining temperature increase in the region adjacent to thin film 52.

Figure 27:
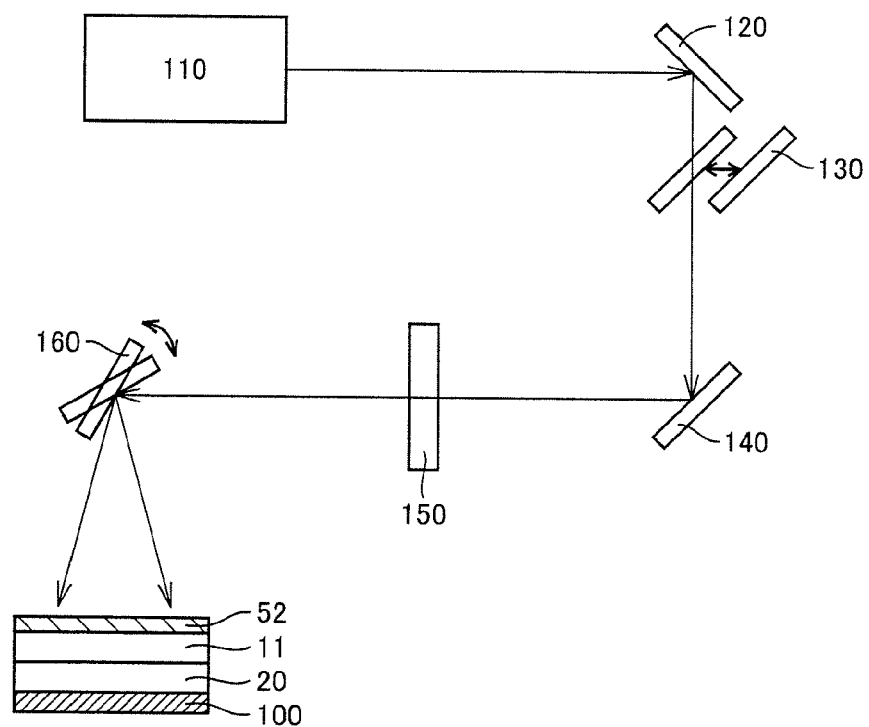
FIG. 27 is a schematic view for illustrating a configuration of a laser annealing device.

Referring to FIG. 27, the following describes a configuration of a laser annealing device. The laser annealing device includes a laser 110, mirrors 120, 140, a shutter 130, a beam shaping lens 150, and a movable mirror 160. As laser 110, for example, a $YVO_4$ solid-state laser is used. Laser light emitted from laser 110 is reflected by mirrors 120, 140 to reach beam shaping lens 150. Beam shaping lens 150 shapes it such that in-plane intensity distribution in the laser spot comes close to a flat state. Then, the laser light having passed through beam shaping lens 150 is reflected by movable mirror 160 to reach thin film 52. By moving movable mirror 160, thin film 52 can be scanned by the laser light traveling thereon. It should be noted that the irradiation of the laser light can be controlled by opening or closing shutter 130.

Figure 28:
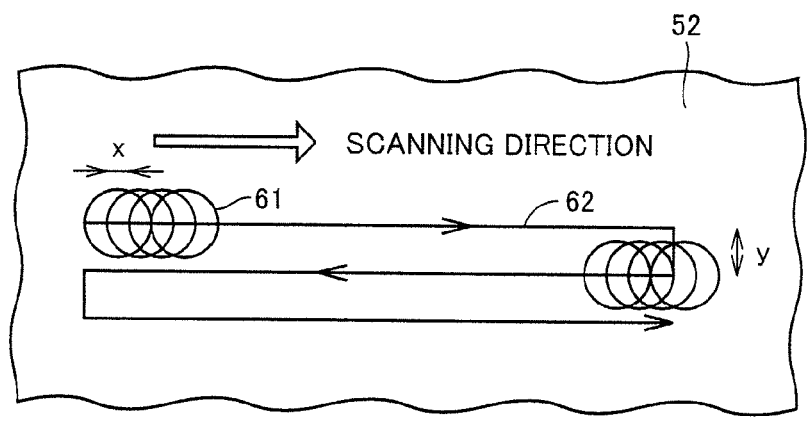
FIG. 28 is a schematic view for illustrating a scanning direction of an irradiation beam spot of laser irradiation.

Referring to FIG. 28, the following describes a method of scanning by means of the irradiation beams of the laser. An irradiation beam spot 61 travels on the surface of thin film 52. Irradiation beam spot 61 has a diameter of, for example, not less than 200 μm and not more than 300 μm. An area of irradiation beam spot 61 on the surface of thin film 52 is preferably 0.03 $mm^2$ or greater. In this way, time for performing the annealing can be shortened. As shown in FIG. 28, irradiation beam spot 61 is moved in such a manner that it overlaps with a previous location of irradiation beam spot 61. For example, in the case where the scanning is performed by 1000 mm per second using a pulse laser of 20 kHz, a scanning step x of irradiation beam spot 61 is 50 μm. The scanning is performed in a certain direction (scanning direction) such that the locations of irradiation beam spot 61 overlap with each other. A trajectory of the scanning with irradiation beam spot 61 in the certain direction is called "scanning line 62". When the length of scanning line 62 reaches a certain length, the scanning direction is turned by 90°. Then, it is moved only by a certain pitch width y. Thereafter, the scanning with irradiation beam spot 61 is performed in parallel with foregoing scanning line 62 before the turning by 90° and in a direction opposite to the scanning direction of foregoing scanning line 62. It should be noted that pitch width y is 100 μm, for example. Pitch width y is preferably equal to or smaller than the half of the diameter of the irradiation beam spot. In this way, the contact resistance between the substrate and the contact electrode can be sufficiently reduced.

The laser has an energy density of, for example, 2.0 $J/cm^2$. The laser preferably has an energy density of not less than 1.9 $J/cm^2$ and not more than 2.2 $J/cm^2$. When the laser has an energy density of 1.9 $J/cm^2$ or greater, excellent ohmic contact can be achieved. On the other hand, when the laser has an energy density of 2.2 $J/cm^2$ or smaller, surface roughness of the contact electrode can be suppressed. More preferably, the laser has an energy density of not less than 2.0 $J/cm^2$ and not more than 2.2 $J/cm^2$.

With the laser light passing through beam shaping lens 150, in-plane distribution of laser irradiation energy intensity in the surface of thin film 52 becomes small. The in-plane power distribution of the laser irradiation energy intensity of the irradiation beam spot of the laser is preferably within ±30%.

In this way, the surface roughness of the contact electrode after the laser irradiation can be suppressed and adhesion between the contact electrode and the pad electrode can be improved.

Figure 29:
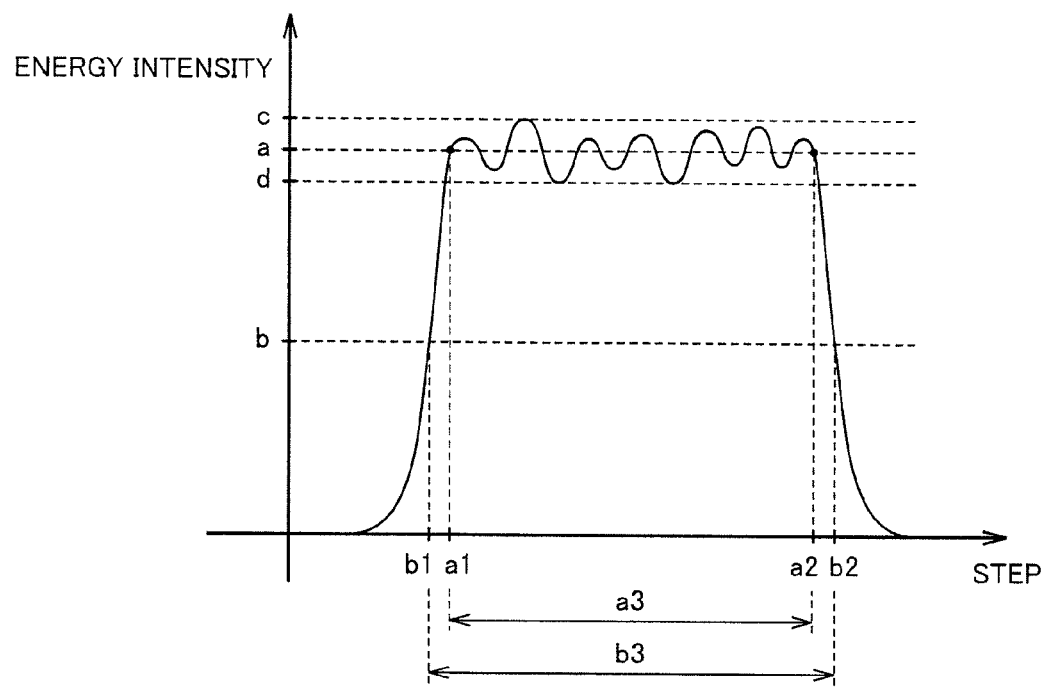
FIG. 29 is a diagram for illustrating energy intensity distribution of irradiation beams of the laser irradiation.

Referring to FIG. 29, the following describes a definition of the in-plane power distribution. In FIG. 29, the horizontal axis represents the scanning direction (step) of the laser irradiation spot on the surface of thin film 52, and the vertical axis represents the energy intensity of the laser irradiation. As shown in FIG. 29, the energy intensity is substantially constant around the central portion in the laser beams. A width b3 of the laser beams in an energy intensity b, which is $1/e^2$ of an average energy intensity c of the central portion, corresponds to the diameter of the irradiation beam spot. The in-plane power distribution refers to a ratio of each of a maximum energy intensity c and a minimum energy intensity d in a flat region a3 to average energy intensity a. In flat region a3, the energy intensity is substantially constant.

Next, as a step (S80), a backside pad electrode forming step is performed. In this step (S80), referring to FIG. 13, while supporting third intermediate substrate 17 by adhesive tape 6, a backside pad electrode 80 is formed on and in contact with drain electrode 51. Specifically, first, a first electrode layer (not shown) made of Ti, TiN, TiW, or NiCr is formed on drain electrode 51 by means of sputtering, for example. Next, also by means of the sputtering, a second electrode layer (not shown) made of Pt or Ni is formed on the first electrode layer. Next, also by means of the sputtering, a third electrode layer (not shown) made of Au or Ag is formed on the second electrode layer. In this way, a fourth intermediate substrate 18 is fabricated in which backside pad electrode 80 thus having a stacking structure of the above-described electrode layers is formed on drain electrode 51. By employing Ti, TiN, TiW, or NiCr for the metal constituting the first electrode layer formed on and in contact with drain electrode 51, adhesion between backside pad electrode 80 and drain electrode 51 can be further improved.

Figure 14:
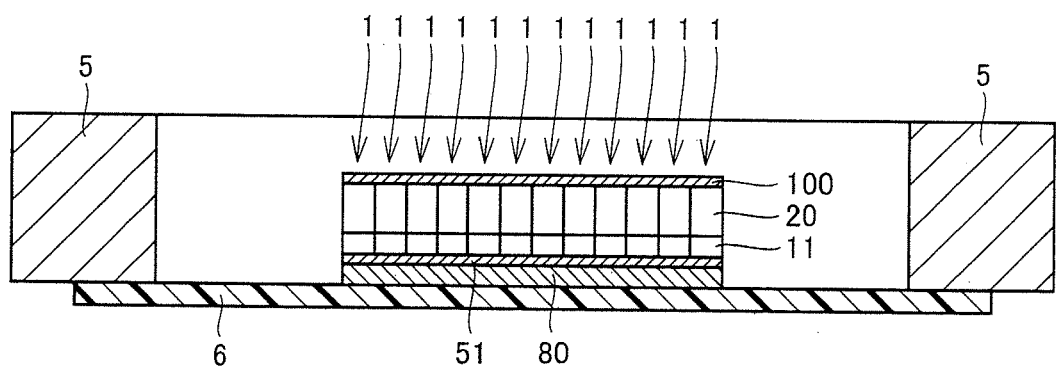
FIG. 14 is a schematic cross sectional view for illustrating the method for manufacturing the MOSFET.

Next, a reversing step is performed as a step (S90). In this step (S90), referring to FIG. 14, an adhesive tape 6 is adhered to the main surface of fourth intermediate substrate 18 at the backside pad electrode 80 side, and adhesive tape 6 at the electrode layer 100 side is removed. Accordingly, as shown in FIG. 14, fourth intermediate substrate 18 is supported by adhesive tape 6 with the fourth intermediate substrate 18 being reversed from the state shown in the above-described step (S80). As a result, the electrode layer 100 side of fourth intermediate substrate 18 can be observed, whereby the next step (S100) can be readily performed.

Next, as step (S100), a dicing step is performed. In this step (S100), referring to FIG. 14, with adhesive tape 6 being adhered to the main surface thereof at the backside pad electrode 80 side so as to support fourth intermediate substrate 18 using adhesive tape 6, fourth intermediate substrate 18 is cut in the thickness direction thereof, thereby obtaining a plurality of MOSFETs 1. This cutting may be performed by means of laser dicing or scribing, for example. By performing steps (S10) to (S100), MOSFETs 1 are manufactured, thus completing the method for manufacturing the semiconductor device in the present embodiment. Thus, in the method for manufacturing the semiconductor device in the present embodiment, no heating treatment or similar treatment is performed during a period of time until the completion of step (S100) after the formation of backside pad electrode 80 in step (S 80). Specifically, backside pad electrode 80 formed in step (S80) is maintained at a temperature of 300° C. or smaller until MOSFETs 1 are completed by finishing step (S100).

As described above, according to the method for manufacturing the semiconductor device in the present embodiment, drain electrode 51 made of a TiSi or TiAlSi alloy is formed. Thus, with no heating treatment being performed after forming backside pad electrode 80 on and in contact with drain electrode 51, specifically, with backside pad electrode 80 being maintained at a temperature of 300° C. or smaller, excellent adhesion between drain electrode 51 and backside pad electrode 80 can be achieved. Thus, according to the method for manufacturing the semiconductor device in the present embodiment, the manufacturing process can be efficient while achieving excellent adhesion between drain electrode 51 and backside pad electrode 80.

Further, in the method for manufacturing the semiconductor device in the present embodiment, backside pad electrode 80 formed in step (S80) may be maintained at a temperature of 100° C. or smaller until the completion of MOSFETs 1. Thus, in the method for manufacturing the semiconductor device in the present embodiment, even when backside pad electrode 80 is maintained at such a lower temperature, excellent adhesion between drain electrode 51 and backside pad electrode 80 can be achieved.

Further, in the method for manufacturing the semiconductor device in the present embodiment, the above-described steps (S50), (S70), (S80), and (S100) are performed with second intermediate substrate 16 being supported by adhesive tape 6, but the method for manufacturing the semiconductor device in the present invention is not limited to this. In other words, second intermediate substrate 16 may be detached from adhesive tape 6 after performing step (S50).

(Second Embodiment)

The following describes another embodiment of the present invention, i.e., a second embodiment. A method for manufacturing a semiconductor device in the present embodiment is performed through basically the same steps as those in the method for manufacturing the semiconductor device in the first embodiment, and provides effects similar to those in the first embodiment. The method for manufacturing the semiconductor device in the present embodiment is different from the method for manufacturing the semiconductor device in the first embodiment in that a substrate having a plurality of SiC substrates arranged side by side on a base layer is used as the base substrate.

Figure 15:
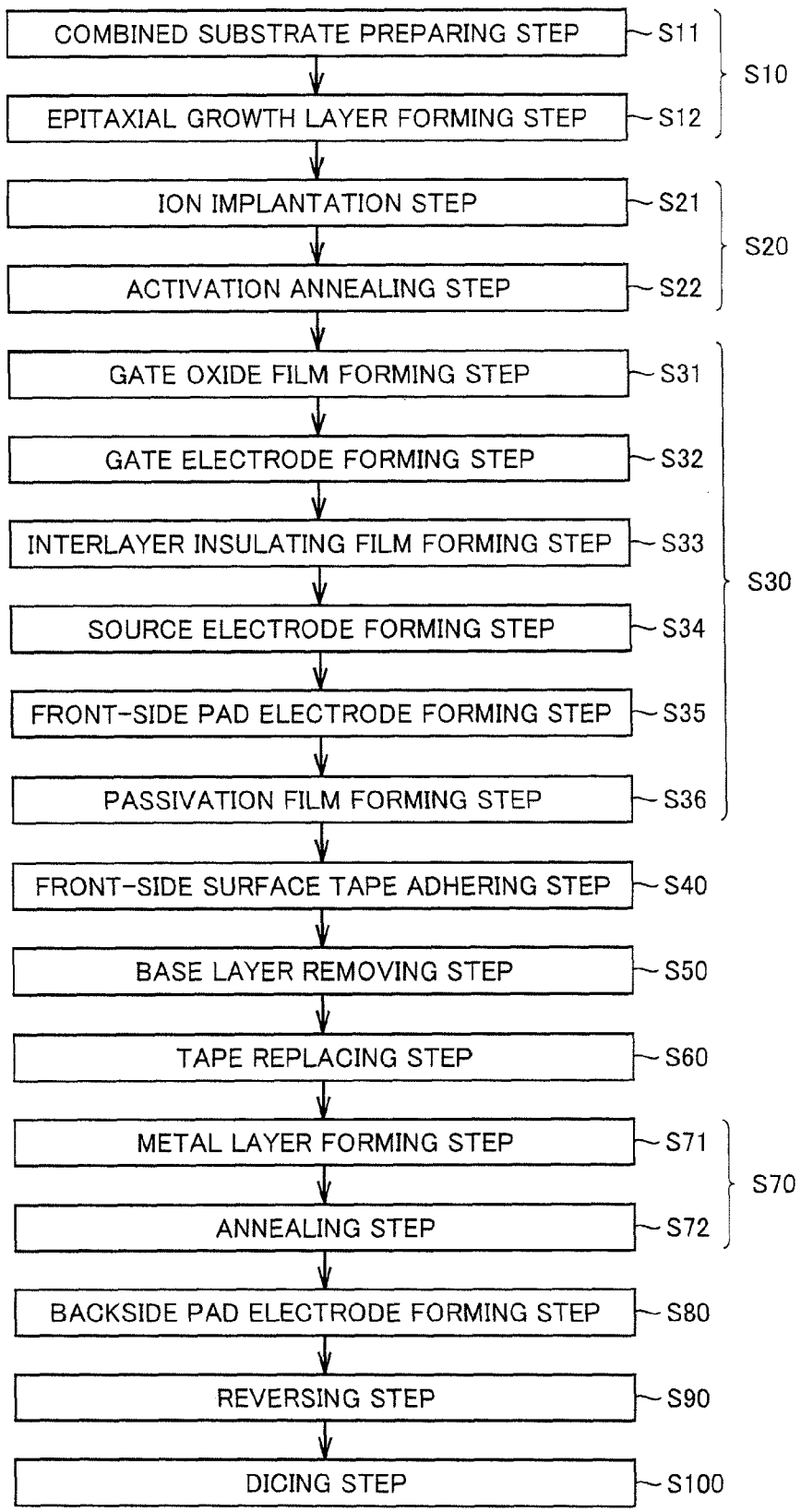
FIG. 15 is a flowchart schematically showing a method for manufacturing a MOSFET according to a second embodiment.

The following describes the method for manufacturing the semiconductor device in the present embodiment. Referring to FIG. 15, first, as a step (S10), a substrate preparing step is performed. In this step (S10), steps (S11) and (S12) described below are performed to prepare a substrate 10 made of silicon carbide.

Figure 16:
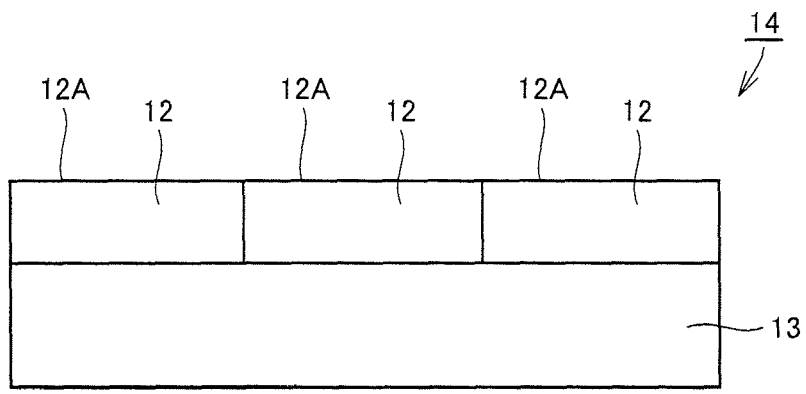
FIG. 16 is a schematic view for illustrating the method for manufacturing the MOSFET according to the second embodiment.

First, as step (S11), a combined substrate preparing step is performed. In this step (S11), referring to FIG. 16, a combined substrate 14 is prepared in which a plurality of SiC substrates 12 each made of single-crystal silicon carbide are arranged side by side when viewed in a plan view and main surfaces of the plurality of SiC substrates 12 at one side are connected to each other by base layer 13. An exemplary SiC substrate 12 employable is a substrate made of hexagonal silicon carbide such as 4H—SiC. Meanwhile, for base layer 13, a substrate made of a material different from silicon carbide such as a metal may be employed. However, it is preferable to employ a substrate made of silicon carbide in order to suppress the substrate from warping due to a difference in physical property such as thermal expansion coefficient. Further, as the silicon carbide constituting base layer 13, polycrystal silicon carbide or amorphous silicon carbide may be employed, but it is preferable to employ single-crystal silicon carbide of hexagonal silicon carbide such as 4H—SiC.

Further, in this step (S11), combined substrate 14 may be prepared in which main surface 12A of each of the plurality of SiC substrates 12 opposite to the side at which they are connected to each other by base layer 13 has an off angle of not less than 50° and not more than 65° relative to the {0001} plane. In this way, a MOSFET 2 having a high channel mobility can be readily manufactured.

Figure 17:
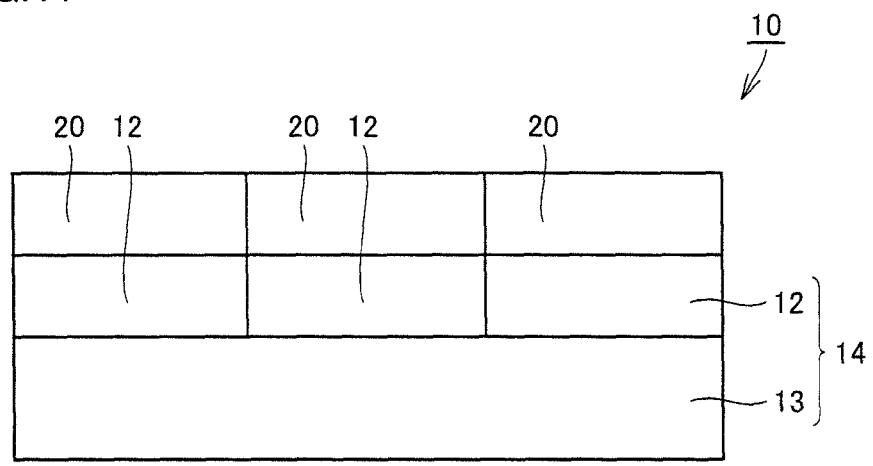
FIG. 17 is a schematic view for illustrating the method for manufacturing the MOSFET according to the second embodiment.

Next, as step (S12), an epitaxial growth layer forming step is performed. In this step (S12), referring to FIG. 17, a semiconductor layer 20 made of silicon carbide and having n type conductivity is formed on each of SiC substrates 12 of combined substrate 14. In this way, substrate 10 including combined substrate 14 and semiconductor layer 20 is prepared.

Next, as a step (S20), an active region forming step is performed. In this step (S20), as with the first embodiment, an ion implantation step (S21) and an activation annealing step (S22) are performed to fabricate a first intermediate substrate in which an active region is formed in substrate 10.

Figure 18:
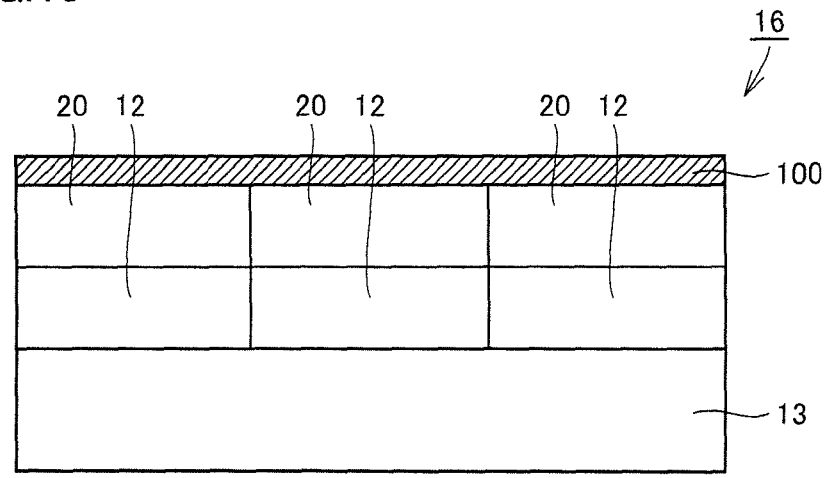
FIG. 18 is a schematic view for illustrating the method for manufacturing the MOSFET according to the second embodiment.

Next, as a step (S30), an electrode layer forming step is performed. In this step (S30), referring to FIG. 18, as with the first embodiment, a gate oxide film forming step (S31), a gate electrode forming step (S32), an interlayer insulating film forming step (S33), a source electrode forming step (S34), a front-side pad electrode forming step (S35), and a passivation film forming step (S36) are performed to fabricate a second intermediate substrate 16 in which an electrode layer 100 is formed.

Figure 19:
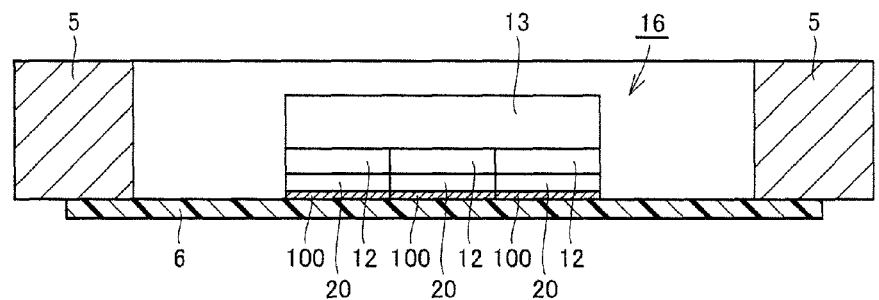
FIG. 19 is a schematic view for illustrating the method for manufacturing the MOSFET according to the second embodiment.

Next, as a step (S40), a front-side tape adhering step is performed. In this step (S40), referring to FIG. 19, as with the first embodiment, a main surface of second intermediate substrate 16 at the electrode layer 100 side is adhered to an adhesive tape 6, whereby second intermediate substrate 16 is supported by adhesive tape 6. In this way, as shown in FIG. 19, the plurality of SiC substrates 12 are supported by adhesive tape 6 with the plurality of SiC substrates 12 being arranged side by side when viewed in a plan view.

Figure 20:
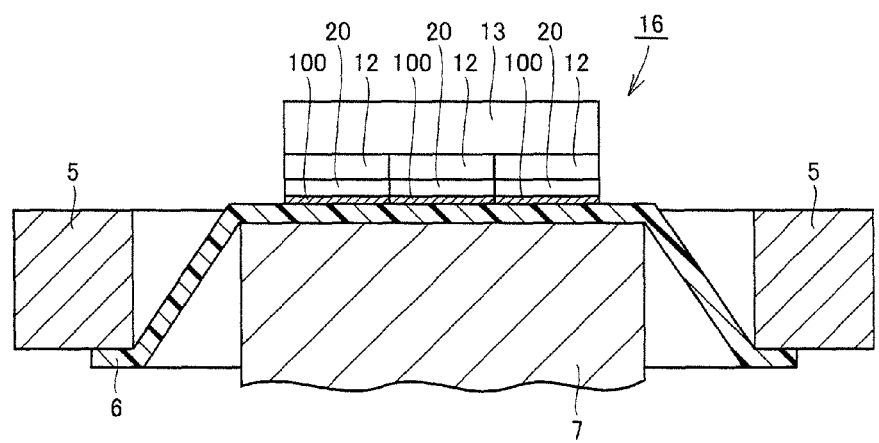
FIG. 20 is a schematic view for illustrating the method for manufacturing the MOSFET according to the second embodiment.
Figure 21:
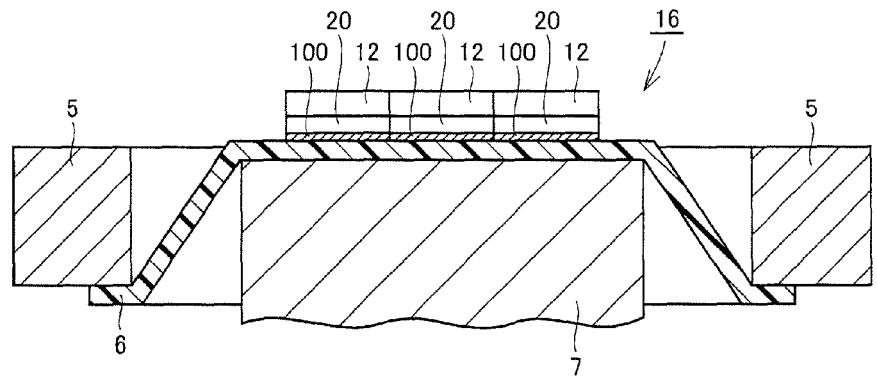
FIG. 21 is a schematic view for illustrating the method for manufacturing the MOSFET according to the second embodiment.

Next, as a step (S50), a base layer removing step is performed. In this step (S50), as with the first embodiment, while second intermediate substrate 16 is supported by adhesive tape 6, the main surface of second intermediate substrate 16 opposite to the electrode layer 100 side is grinded. Here, in the present embodiment, by grinding the main surface of second intermediate substrate 16, base layer 13 is removed. Specifically, referring to FIG. 20, the main surface of adhesive tape 6 opposite to its side holding second intermediate substrate 16 is first pressed by a pressing member 7 in the axial direction of ring frame 5. Accordingly, at least base layer 13 of second intermediate substrate 16 is deviated from a location surrounded by the inner circumference surface of ring frame 5. Then, base layer 13 is grinded by pressing it against the grinding surface of the grinding device, thereby removing base layer 13 as shown in FIG. 21. Thus, in the present embodiment, step (S50) is performed with second intermediate substrate 16 being supported by adhesive tape 6, thereby avoiding the plurality of SiC substrates 12 from being separated from each other by removing base layer 13. As a result, the manufacturing process can become more efficient.

Next, as a step (S60), a tape replacing step is performed. In this step (S60), as with the first embodiment, after completion of step (S50), adhesive tape 6, which might be damaged due to elastic deformation or the like, is replaced.

Figure 22:
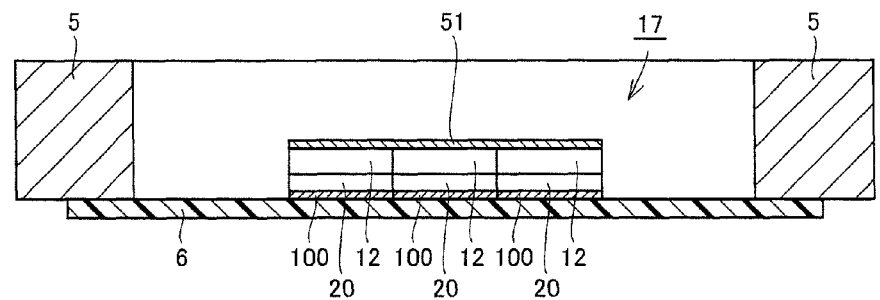
FIG. 22 is a schematic view for illustrating the method for manufacturing the MOSFET according to the second embodiment.

Next, as a step (S70), a drain electrode forming step is performed. In this step (S70), referring to FIG. 22, as with the first embodiment, a metal layer forming step (S71) and an annealing step (S72) are performed. In this way, a third intermediate substrate 17 is fabricated in which drain electrode 51 made of a TiSi or TiAlSi alloy is formed on the main surfaces of SiC substrates 12, which are exposed by the removal of base layer 13 in second intermediate substrate 16.

Figure 23:
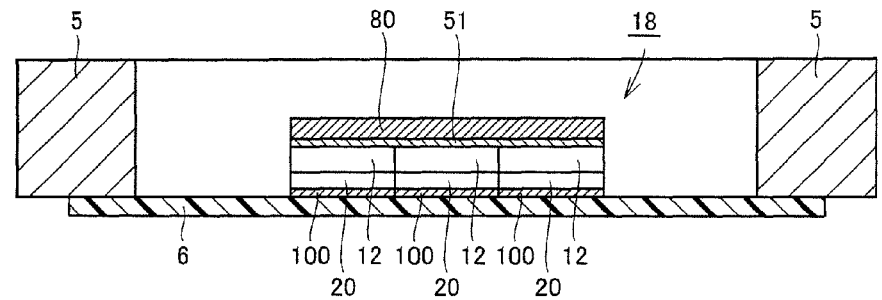
FIG. 23 is a schematic view for illustrating the method for manufacturing the MOSFET according to the second embodiment.

Next, as a step (S80), a backside pad electrode forming step is performed. In this step (S80), referring to FIG. 23, as with the first embodiment, a fourth intermediate substrate 18 is fabricated in which a backside pad electrode 80 is formed on and in contact with drain electrode 51 in third intermediate substrate 17.

Figure 24:
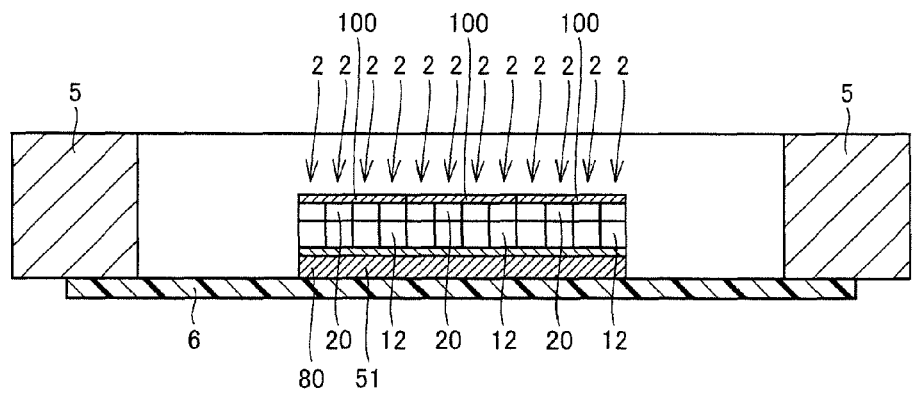
FIG. 24 is a schematic view for illustrating the method for manufacturing the MOSFET according to the second embodiment.

Next, as a step (S90), a reversing step is performed. In this step (S90), referring to FIG. 24, as with the first embodiment, fourth intermediate substrate 18 is supported by adhesive tape 6 in a state reverse to that in step (S80).

Next, as a step (S100), a dicing step is performed. In this step (S100), referring to FIG. 24, as with the first embodiment, while supporting fourth intermediate substrate 18 by adhesive tape 6, fourth intermediate substrate 18 is cut in the thickness direction thereof, thereby obtaining a plurality of MOSFETs 2. By performing steps (S10) to (S100) described above, MOSFETs 2 are manufactured, thus completing the method for manufacturing the semiconductor device in the present embodiment. Thus, as with the method for manufacturing the semiconductor device in the first embodiment, in the method for manufacturing the semiconductor device in the present embodiment, no heating treatment or similar treatment is performed during a period of time until the completion of step (S100) after the formation of backside pad electrode 80 in step (S80).

As described above, as with the method for manufacturing the semiconductor device in the first embodiment, in the method for manufacturing the semiconductor device in the present embodiment, drain electrode 51 made of a TiSi or TiAlSi alloy is formed. Thus, excellent adhesion is achieved between drain electrode 51 and backside pad electrode 80 without performing a heating treatment after the formation of backside pad electrode 80. As a result, the manufacturing process can be efficient. Further, in the method for manufacturing the semiconductor device in the present embodiment, combined substrate 14 is employed in which the plurality of SiC substrates 12 excellent in crystallinity are arranged side by side when viewed in a plan view and are connected to each other by base layer 13. In this way, a substrate 10 that can be handled as a silicon carbide substrate excellent in crystallinity and having a large diameter can be readily prepared. Thus, in the method for manufacturing the semiconductor device in the present embodiment, substrate 10 having such a large diameter is employed, thereby achieving a more efficient process of manufacturing the semiconductor devices.

EXAMPLE

In the present example, the following four types of thin films each formed on a silicon carbide substrate were prepared in order to evaluate a relation between an energy density in laser annealing for heating each of the thin films and a contact resistance between the substrate and the thin film after the laser annealing.

First, four types of samples were prepared in which electrode patterns were formed on an n type silicon carbide substrate. Prepared as a sample 201 was an electrode pattern constituted of a thin film 52 having a Ti portion and a Si portion uniformly mixed by simultaneously sputtering Ti and Si. Thin film 52 contains Ti at a content of 50 volume %. Prepared as a sample 202 was an electrode pattern constituted of a thin film 52 in which a layer 53 constituted of a Ti portion and a layer 54 constituted of a Si portion were stacked on each other. Thin film 52 contains Ti at a content of 55 volume %. Prepared as a sample 203 was an electrode pattern constituted of a thin film only composed of a Ti portion. Prepared as a sample 204 was an electrode pattern constituted of a thin film 52 in which a layer 53 constituted of a Ti portion and a layer 54 constituted of a Si portion were stacked on each other. This thin film contains Ti at a content of 17 volume %. Each of the electrode patterns of samples 201-204 described above was adapted to have a thickness of 1000 angstrom.

Figure 30:
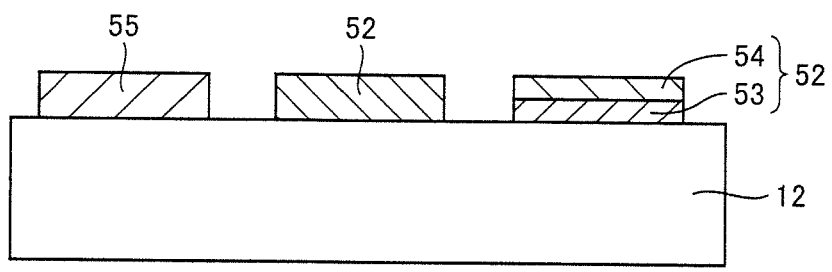
FIG. 30 is a schematic cross sectional view for illustrating a method of measuring a contact resistance of an electrode pattern of each of examples.

Referring to FIG. 30, in each thin film 52 in which layer 53 constituted of the Ti portion and layer 54 constituted of the Si portion were stacked on each other, layer 53 constituted of the Ti portion is formed in contact with SiC substrate 12 and layer 54 constituted of the Si portion is formed on layer 53 constituted of the Ti portion. Thin film 52 obtained by simultaneously sputtering Ti and Si was formed in contact with SiC substrate 12. Thin film 55 constituted of only the Ti portion was formed in contact with SiC substrate 12.

Each of the electrodes was subjected to laser annealing and was evaluated in contact resistance by means of a TLM (Transmission Line Model) method. Specifically, TLM electrode patterns respectively having the above-described electrode structures were fabricated on an n+ layer having a donor (N) concentration of $1.5 \times 10^{19}$ cm$^{-3}$, and were annealed with the energy density in laser irradiation being varied, so as to measure respective contact resistances for the energy densities thus varied.

Figure 31:
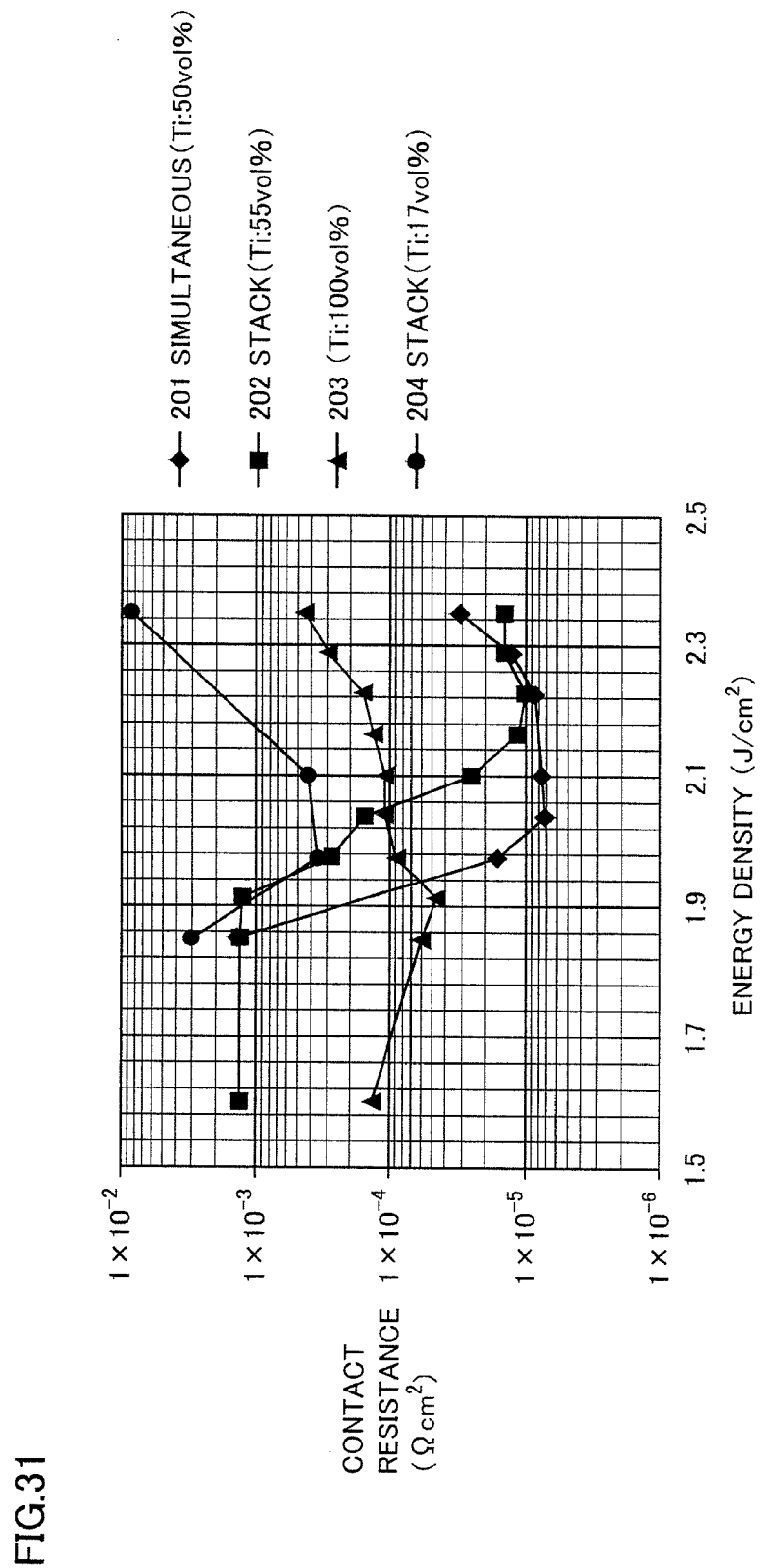
FIG. 31 is a diagram showing a relation between the contact resistance of the electrode pattern and the energy density in each of the examples.

Referring to FIG. 31, the following describes a relation between the contact resistance and the energy density.

In sample 201 obtained by simultaneously sputtering Ti and Si, when the energy density in the laser irradiation was smaller (for example, energy density of approximately 1.9 J/cm$^2$), the contact resistance was higher. However, as the energy density in the laser irradiation was increased, the contact resistance was decreased abruptly. As shown in FIG. 31, when sample 201 was subjected to laser annealing at an energy density of approximately 2.0 J/cm$^2$, the contact resistance was the lowest. Here, such a low contact resistance indicates that ohmic characteristics between SiC substrate 12 and the electrode pattern were good. In other words, when performing laser annealing at an energy density of approximately 2.0 J/cm$^2$, a contact electrode having excellent ohmic characteristics can be formed.

In the case of sample 202 having the Ti portion and the Si portion stacked on each other, a contact electrode having excellent ohmic characteristics can be formed by performing laser annealing at an energy density of approximately 2.2 J/cm$^2$. As compared with sample 201 formed by simultaneously sputtering Ti and Si, the laser annealing needs to be performed at a higher energy density in order to attain excellent ohmic characteristics in sample 202 having the Ti portion and the Si portion stacked on each other.

In sample 203 constituted of only the Ti portion, the contact resistance was not changed much even though the energy density was varied. Further, under the condition that the energy density was 2.2 J/cm$^2$, the contact resistance of sample 203 was higher than the contact resistances of sample 201 and sample 202. In other words, each of sample 201 and sample 202 had more excellent ohmic characteristics than sample 203 under the condition that the energy density was 2.2 J/cm$^2$.

In comparison between sample 204 and sample 202, under the condition that the energy density was 2.2 J/cm$^2$ for example, the contact resistance of sample 202 was lower than that of sample 204. In other words, it was confirmed that in the case of the electrode patterns each having the Ti portion and the Si portion stacked on each other, a contact electrode having more excellent ohmic contact can be formed as the Ti content is higher.

As described above, it was confirmed that sample 201 obtained by simultaneously sputtering Ti and Si and sample 202 having the Ti portion and the Si portion stacked on each other can achieve lower contact resistances than that of sample 203 constituted of only the Ti portion. Further, it was confirmed that sample 201 obtained by simultaneously sputtering Ti and Si can achieve excellent ohmic characteristics under an annealing condition with an energy density lower than that for sample 202 having the Ti portion and the Si portion stacked on each other.

The method for manufacturing the semiconductor device in the present invention is particularly advantageously applicable to a method for manufacturing a semiconductor device, which is required to provide an efficient manufacturing process while achieving excellent adhesion between electrodes.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a semiconductor device comprising the steps of:
   preparing a substrate made of silicon carbide;
   forming a contact electrode making ohmic contact with said substrate; and
   forming a pad electrode on and directly and physically in contact with said contact electrode,
   the step of forming said contact electrode including the step of performing annealing,
   said contact electrode formed in the step of forming said contact electrode being made of an alloy containing Ti and Si,
   said pad electrode formed in the step of forming said pad electrode being maintained at a temperature of 300° C. or smaller until completion of said semiconductor device.

2. The method for manufacturing the semiconductor device according to claim 1, wherein said pad electrode formed in the step of forming said pad electrode is maintained at a temperature of 100° C. or smaller until the completion of said semiconductor device.

3. The method for manufacturing the semiconductor device according to claim 1, wherein said substrate prepared in the step of preparing said substrate includes a structure in which a plurality of SiC substrates each made of single-crystal silicon carbide are arranged side by side when viewed in a plan view and main surfaces of said plurality of SiC substrates at one side are connected to each other by a base layer.

4. The method for manufacturing the semiconductor device according to claim 1 further comprising, before the step of forming said contact electrode, the steps of:
   fabricating a first intermediate substrate by forming an active region in said substrate;
   fabricating a second intermediate substrate by forming an electrode layer on a side of said substrate opposite to its side where said contact electrode is to be formed;
   supporting said second intermediate substrate using an adhesive tape by adhering, to said adhesive tape, the side of said second intermediate substrate on which said electrode layer is formed; and
   grinding a main surface of said substrate at the side where said contact electrode is to be formed, with said second intermediate substrate being supported by said adhesive tape, wherein:

the step of forming said contact electrode includes the steps of
- forming a metal layer made of an alloy containing Ti and Si on said main surface grinded, with said second intermediate substrate being supported by said adhesive tape, and
- fabricating a third intermediate substrate in which said contact electrode is formed on said second intermediate substrate, by heating said metal layer, and in the step of forming said pad electrode, a fourth intermediate substrate is fabricated by forming said pad electrode on and in contact with said contact electrode, with said third intermediate substrate being supported by said adhesive tape.

5. The method for manufacturing the semiconductor device according to claim 4, wherein in the step of fabricating said third intermediate substrate, said metal layer is locally heated.

6. The method for manufacturing the semiconductor device according to claim 5, wherein in the step of fabricating said third intermediate substrate, said metal layer is locally heated by irradiating said metal layer with laser.

7. The method for manufacturing the semiconductor device according to claim 1, wherein the step of forming said contact electrode includes the step of forming a thin film including a Ti portion and a Si portion.

8. The method for manufacturing the semiconductor device according to claim 7, wherein said thin film is formed by mixing said Ti portion and said Si portion with each other.

9. The method for manufacturing the semiconductor device according to claim 7, wherein said thin film is formed by stacking a layer constituted of said Ti portion and a layer constituted of said Si portion on each other.

10. The method for manufacturing the semiconductor device according to claim 7, wherein said thin film has a film thickness of 10 nm or greater.

11. The method for manufacturing the semiconductor device according to claim 7, wherein said thin film contains Ti at a content of not less than 20 volume % and not more than 95 volume %.

12. The method for manufacturing the semiconductor device according to claim 7, wherein said thin film contains Ti at a content of not less than 50 volume % and not more than 70 volume %.

13. The method for manufacturing the semiconductor device according to claim 7, wherein in the step of performing said annealing, said thin film is locally heated by irradiating said thin film with laser.

14. The method for manufacturing the semiconductor device according to claim 13, wherein said laser has an energy density of not less than 1.9 J/cm$^2$ and not more than 2.2 J/cm$^2$.

15. The method for manufacturing the semiconductor device according to claim 13, wherein said laser has an irradiation beam spot having an area of 0.03 mm$^2$ or greater.

16. The method for manufacturing the semiconductor device according to claim 13, wherein in-plane power distribution of an irradiation beam spot of said laser is within ±30%.

17. The method for manufacturing the semiconductor device according to claim 13, wherein each of a scanning step of an irradiation beam spot of said laser in a laser scanning direction and a pitch width between adjacent irradiation lines thereof is equal to or smaller than a half of a diameter of said irradiation beam spot.

* * * * *